US005302238A

United States Patent [19]

Roe et al.

[11] Patent Number: 5,302,238

[45] Date of Patent: Apr. 12, 1994

[54] PLASMA DRY ETCH TO PRODUCE ATOMICALLY SHARP ASPERITIES USEFUL AS COLD CATHODES

[75] Inventors: Fred L. Roe; Kevin Tjaden, both of Boise, Id.

[73] Assignee: Micron Technology, Inc., Boise, Id.

[21] Appl. No.: 883,074

[22] Filed: May 15, 1992

[51] Int. Cl.[5] .......... H01L 21/00

[52] U.S. Cl. .......... 156/643; 156/646; 156/657; 156/661.1; 156/662; 445/50; 445/51

[58] Field of Search .......... 156/657, 659.1, 662, 156/643, 646, 661.1; 445/50, 51

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 4,310,380 | 1/1982 | Flamm et al. | 156/646 X |
| 4,639,288 | 1/1987 | Price et al. | 156/646 X |
| 4,741,799 | 5/1988 | Chen et al. | 156/657 X |
| 4,766,340 | 8/1988 | van der Mast et al. | 313/366 |
| 4,940,916 | 7/1990 | Borel et al. | 313/306 |
| 4,968,382 | 11/1990 | Jacobson et al. | 156/646 X |
| 4,968,585 | 11/1990 | Albrecht et al. | 156/662 X |
| 4,986,877 | 1/1991 | Tachi et al. | 156/646 X |
| 5,064,396 | 11/1991 | Spindt et al. | 445/50 |
| 5,066,358 | 11/1991 | Quate et al. | 156/662 X |
| 5,082,524 | 1/1992 | Cathey | 156/643 |
| 5,094,712 | 3/1992 | Becker et al. | 156/643 |
| 5,126,287 | 6/1992 | Jones | 156/643 X |
| 5,201,992 | 4/1993 | Marcus et al. | 156/643 |

OTHER PUBLICATIONS

Keiichi Betsui, "Fabrication and Characteristics of Si Field Emitter Arrays" Technical Digest of IVMC, 1991, pp. 26-29.

Marcus et al., "Formation of Silicon Tips with 1 nm Radius", Appl. Physics Letter, vol. 56, No. 3, Jan. 15, 1990.

Hunt et al., "Structure and Electrical Characteristics of Silicon Field-Emission Microelectronic Devices", IEEE Transaction on Electron Devices, vol. 38, No. 10, Oct. 1991.

McGruer et al., "Oxidation-Sharpened Gated Field Emitter Array Process", IEEE Transactions on Electron Devices, vol. 38, No. 10, Oct. 1991.

Farooqui et al., "Microfabrication of Submicron Nozzles in Silicon Nitride", Journal of Microelectromechanical Systems, vol. 1, No. 2, Jun. 1992, pp. 86-88.

*Primary Examiner*—Thi Dang

*Attorney, Agent, or Firm*—Lia M. Pappas

[57] ABSTRACT

An in situ plasma dry etching process for the formation of automatically sharp cold cathode emitter tips for use in field emission displays in which i) a mask layer is deposited on a substrate, ii) a photoresist layer is patterned superjacent the mask layer at the sites where the emitter tips are to be formed, iii) the mask is selectively removed by plasma etching, iv) after which the substrate is etched in the same plasma reacting chamber, thereby creating sharp electron emitter tips.

14 Claims, 3 Drawing Sheets

PLASMA DRY ETCH TO PRODUCE ATOMICALLY SHARP ASPERITIES USEFUL AS COLD CATHODES

FIELD OF THE INVENTION

This invention relates to flat panel displays, and more particularly, to a process for the formation of very sharp tips, such as cold cathode emitter tips.

BACKGROUND OF THE INVENTION

The present invention uses a substrate which, in the preferred embodiment includes a silicon layer. However, a deposited material, such as polysilicon or amorphous silicon, may also be used. Typically, these are semiconductor wafers, although it is possible to use other materials, such as silicon on saphire (SOS). Therefore, "wafers" is intended to refer to the substrate on which the inventive emitter tips are formed.

Flat panel displays have become increasingly important in appliances requiring lightweight portable screens. Currently, such screens use electroluminescent or liquid crystal technology. A promising technology is the use of a matrix-addressable array of cold cathode emission devices to excite phosphor on a screen.

The clarity, or resolution, of a field emission display is a function of a number of factors, including emitter tip sharpness, alignment and spacing of the gates which surround the tips, pixel size, as well as cathode-to-gate and cathode-to-screen potentials. The process of the present invention is directed toward the fabrication of very sharp cathode emitter tips.

A great deal of work has been done in the area of cold cathode tip formation. See, for example, the "Spindt" patents, U.S. Pat. Nos. 3,665,241, and 3,755,704, and 3,812.559 and 5,064,396. See also, U.S. Pat. No. 4,766,340 entitled, "Semiconductor Device having a Cold Cathode," and U.S. Pat. No. 4,940,916 entitled, "Electron Source with Micropoint Emissive Cathodes and Display Means by Cathodeluminescence Excited by Field Emission Using Said Source."

U.S. patent application Ser. No. 837,833, entitled "Method of Creating Sharp Asperities and other Features on the Surface of a Semiconductor Substrate," has the same assignee as the present application. It describes a worthwhile method to fabricate emitter tips, as well, but employs a significantly different approach than the process of the present invention.

In contrast to the above-cited methods, the process of the present invention employs dry etching (also referred to as plasma etching) to fabricate sharp emitter tips. Plasma etching is the selective removal of material through the use of etching gases. It is a chemical process which uses plasma energy to drive the reaction. Those factors which control the precision of the etch are the temperature of the etchant, the time of immersion, and the composition of the gaseous etchant.

Various papers refer to reactive ion etching (RIE) and orientation dependent etching (ODE) of silicon to form cathode emitter tips. These technologies rely on either expensive multiple deposition and evaporation steps, or dry etch processes bound by the isotropic etching characteristics of the process gases. For example, prior art dry etch processes limit the manufacturer to a height to width etch ratio of 1:1. To alter this 1:1 ratio to obtain an increased depth, a deeper mask would be required.

SUMMARY OF THE INVENTION

The process of the present invention involves an in situ plasma etch of a silicon substrate upon which has been deposited a hard mask layer and a patterned photoresist layer. The mask layer is etched to expose the silicon substrate, which silicon substrate is then etched to form the sharp emitter tips. Alternatively, the patterned layer can have the dual function of hard mask layer and photoresist layer.

The process of the present invention can be used to produce atomically sharp tips with relatively any given aspect ratio and height with a single step (in situ) plasma dry etch process. The elimination of steps in a manufacturing process represents a tremendous advantage both in time and money. Further, the less handling of the wafers that is required, the greater the yields which tend to result.

Although the preferred embodiment is a single step process, the process of the present invention can also be carried out in a series of steps whereby the ratio of reactant gases, the power supplied, or the pressure applied, is varied.

BRIEF DESCRIPTION OF THE DRAWINGS

The present invention will be better understood from reading the following description of nonlimitative embodiments, with reference to the attached drawings, wherein.

DETAILED DESCRIPTION OF THE INVENTION

Figure 1:
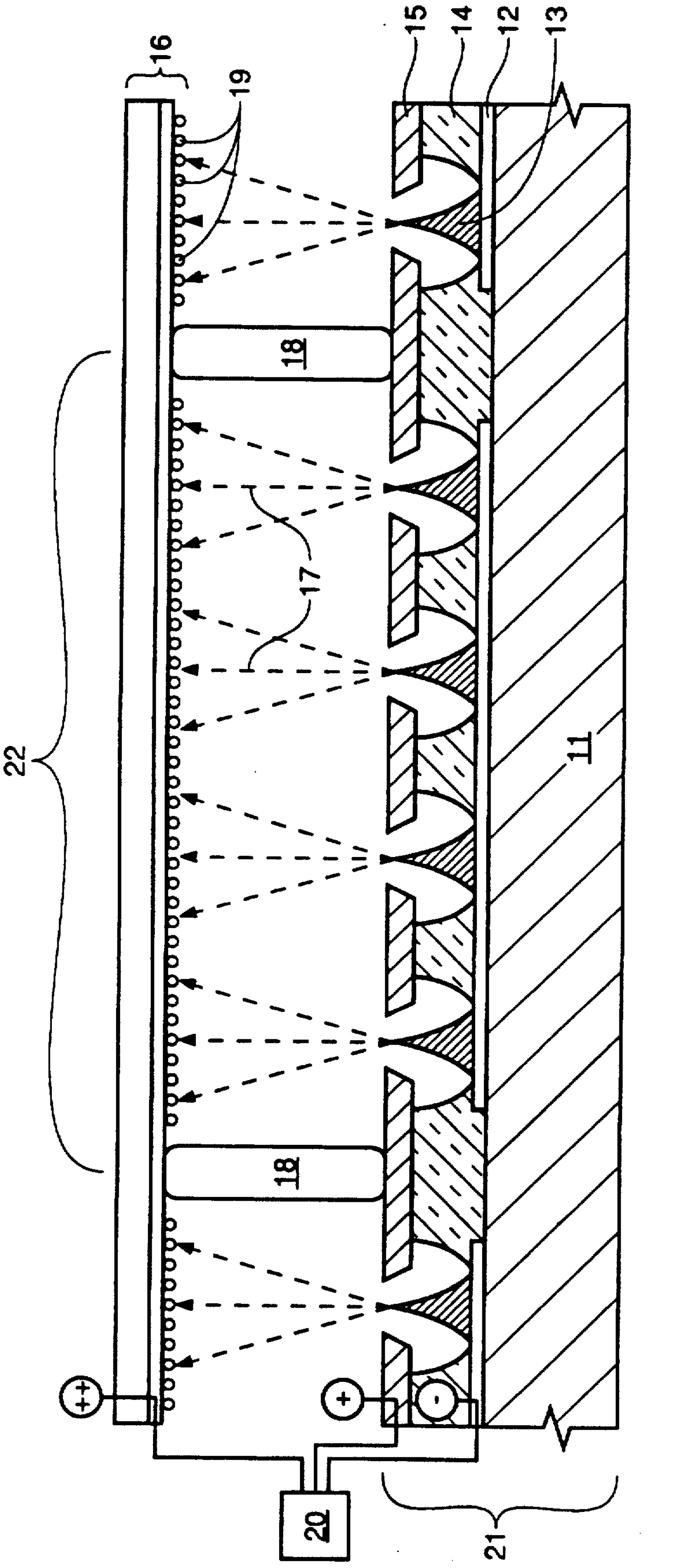
FIG. 1 is a cross-sectional schematic drawing of a pixel of a flat panel display having cathode emitter tips fabricated by the process of the present invention.

Referring to FIG. 1, a field emission display employing a display segment 22 is depicted. Each display segment 22 is capable of displaying a pixel of information, or a portion of a pixel, as, for example, one color output of a pixel. Preferably, a single crystal silicon layer serves as a substrate 11 onto which a conductive material layer 12, such as doped polycrystalline silicon has been deposited.

At a field emission site location, a conical micro-cathode 13 has been constructed on top of the substrate 11. Surrounding the micro-cathode 13, is a low potential anode gate structure 15. When a voltage differential, through source 20, is applied between the cathode 13 and the gate 15, a stream of electrons 17 is emitted toward a phosphor coated screen 16. Screen 16 is an anode. The electron emission tip 13 is integral with the semiconductor substrate 11, and serves as a cathode conductor. Gate 15 serves as a low potential anode or grid structure for its respective cathode 13. A dielectric insulating layer 14 is deposited on the conductive cathode layer 12. The insulator 14 also has an opening at the field emission site location.

Disposed between said faceplate 16 and said baseplate 21 are located spacer support structures 18 which function to support the atmospheric pressure which exists on the electrode faceplate 16 as a result of the vacuum which is created between the baseplate 21 and faceplate 16 for the proper functioning of the emitter tips 13.

The baseplate 21 of the invention comprises a matrix addressable array of cold cathode emission structures 13, the substrate 11 on which the emission structures 13 are created, the conductive material layer 12, the insulating layer 14, and the anode grid 15.

The process of the present invention yields atomically sharp emitter tips 13. For purposes of this application, "atomically sharp" refers to a degree of sharpness that can not be defined clearly by the human eye when looking at a scanning electron microscope (SEM) micrograph of the structure. In other words, in a SEM micrograph of the cold cathode 13, the human eye can not adequately distinguish where the peak of the cold cathode 13 actually ends because the peak of the cathode emitter 13 is of finer dimensions than the clarity or resolution capable with the SEM, and therefore the tip 13 appears somewhat blurred. In reality, the apex of the cathode emitter 13 is approximately 7Å–10Å across.

Experimental results have yielded emitter tips 13 having base widths of approximately 1$\mu$ and heights in the range of 2$\mu$. Further experimentation is anticipated to yield tips 13 having base widths in the relative range of 0.75$\mu$ to 1.25$\mu$, and relative heights in the approximate range of 0.75$\mu$ to 2.5$\mu$ or more. In the process of the present invention, the balancing of the gases in the plasma etch will enable the manufacturer to determine, and thereby significantly control, the dimensions of the tip 13. Therefore, tips 13 which are taller than 2.5$\mu$ are conceivable using the process of the present invention and the correct etchant gas ratio (e.g. $Cl_2$:$NF_3$ ratio). The greater the ratio of the gases, the taller the resulting tip 13.

Figure 2:
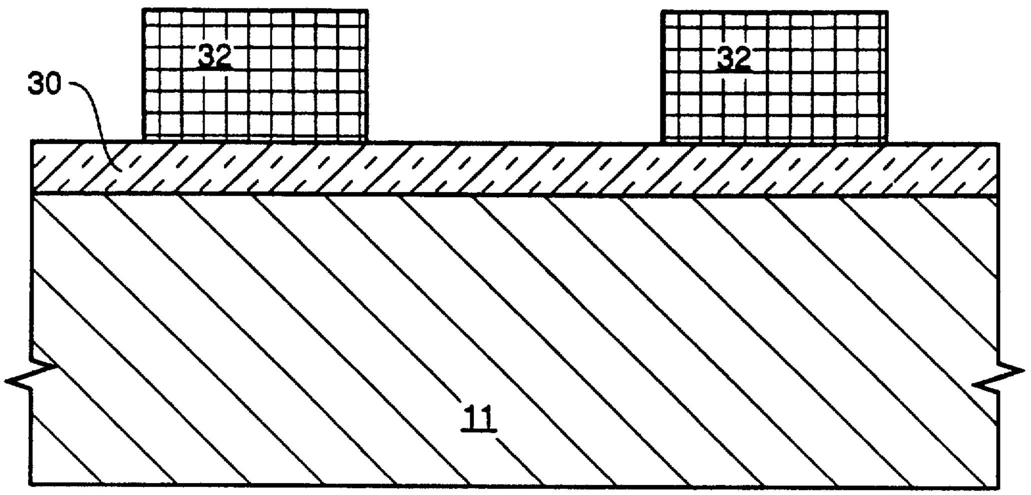
FIG. 2 is a cross-sectional schematic drawing of a substrate on which is deposited a hard mask layer and a patterned photoresist layer.

FIG. 2 depicts the substrate 11, which substrate can be amorphous polysilicon, polysilicon, or any other material from which the emitter tip 13 can be fabricated. The substrate 11 has a mask layer 30 deposited or grown thereon. The hard mask layer 30 can be made of any suitable material which is selective to the substrate 11, the preferred material being an oxide, typically silicon dioxide.

A photoresist layer 32 is patterned on the mask layer 30. Photoresist 32 is commonly used as a mask during plasma etch operations. For etches of silicon, silicon dioxide, silicon nitride, and other metallic and non-metallic compounds, photoresist 32 displays sufficient durability and stability.

Alternatively, a hard mask using only a single photoresist layer 32 can be used. In such a case, an oxide layer would not be needed. The use of a photoresist layer 32 alone is not the preferred method as greater selectivity during the silicon substrate 11 etch is currently available using an oxide layer 30.

Figure 3:
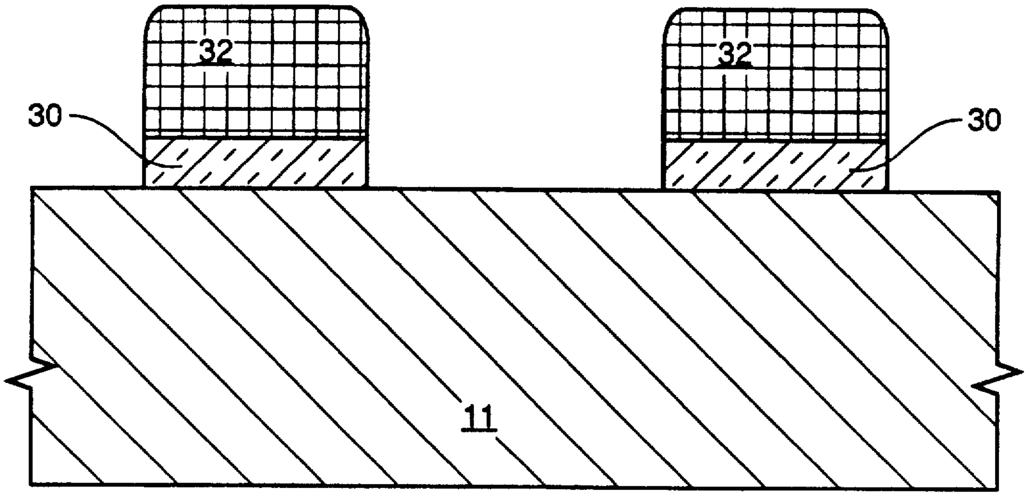
FIG. 3 is a cross-sectional schematic drawing of the structure of FIG. 2, after the mask layer has been selectively removed by plasma dry etch.

The next step in the process is the selective removal of the oxide mask 30 which is not covered by the photoresist pattern 32 (FIG. 3). The selective removal of the hard mask 30 is accomplished preferably through a dry plasma etch, but any oxide etch technique can be used.

In a plasma etch method, the typical etchants used to etch silicon dioxide include, but are not limited to: chlorine and fluorine, and typical gas compounds include: $CF_4$, $CHF_3$, $C_2F_6$, and $C_3F_8$. Fluorine with oxygen can also be used to accomplish the oxide mask 30 etch step. In our experiments $CF_4$, $CHF_3$, and argon were used. The etchant gases are selective with respect to silicon, and the etch rate of oxide is know in the art, so the endpoint of the etch step can be calculated.

In the preferred embodiment, the photoresist layer 32 does not have to be stripped because the photoresist layer 32 is removed in situ during the plasma etch of the substrate 11. Note however, that in changing the balance or ratio of the process etch gases, that the removal rate of the photoresist 32 also changes, and therefore, a removal step of any remaining photoresist 32 may be necessary post-etch. Removal of the photoresist layer 32 can be accomplished by any of the methods known in the art.

Figure 4:
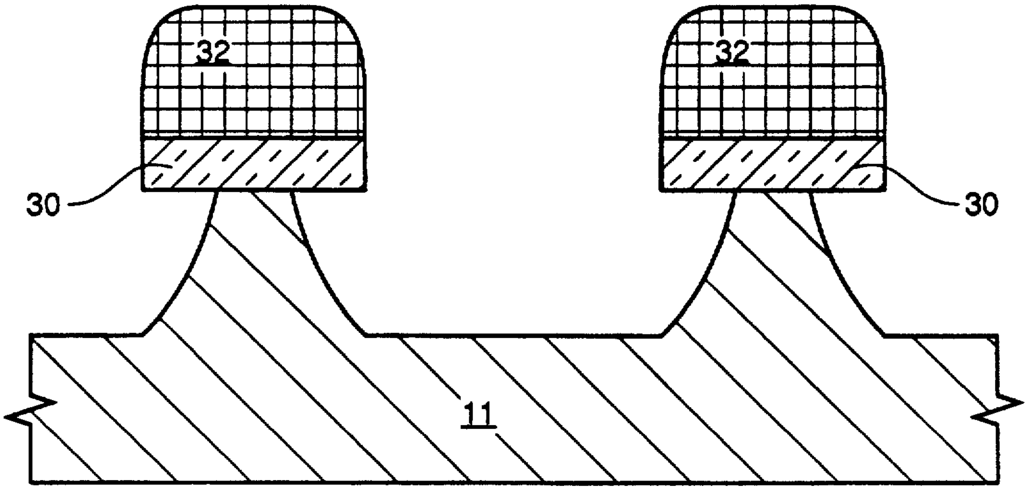
FIG. 4 is a cross-sectional schematic drawing of the structure of FIG. 3, after undergoing a silicon etch.

Immediately after the oxide etch step, preferably in the same chamber and using the same cathode, the silicon layer 11 is etched, this generates a profile as depicted in FIG. 4. Fluorine (preferably $NF_3$, but any fluorine containing process gas can be used) and chlorine (preferably $Cl_2$, but any chlorine containing process gas can be used) are combined in a plasma etching system to create the sharp tips 13 used in field emitting devices. Other silicon etchants include: $CF_4$, $SiF_4$, $CHF_3$, and $SF_6$, and other typical gas compounds include: $BCl_3$, $CCl_4$, $SiCl_4$, and HCl.

An alternative embodiment involves removing the substrate 11 from the plasma reactor after the mask layer 30 has been etched, and then placing the substrate 11 in a second plasma reactor to accomplish the silicon substrate 11 etch. In other words, the process of the present invention need not be carried out in situ, although the in situ method would be the most efficient.

The following are the ranges of parameters for the process described in the present application. Included is a range of values which we investigated during the characterization of the process as well as a range of values which provided the best results for tips 13 that were from 1.5$\mu$ to 2$\mu$ high and 0.75$\mu$ to 1$\mu$ at the base. One having ordinary skill in the art will realize that the values can be varied to obtain tips 13 having other height and width dimensions.

| PARAMETER | INVESTIGATED RANGE | PREFERRED RANGE |
|---|---|---|
| $Cl_2$ | 20-70 SCCM | 40-60 SCCM |
| $NF_3$ | 3-15 SCCM | 8-12 SCCM |
| $Cl_2$:$NF_3$ | 23:1-1.3:1 | 7.5:1-3.3:1 |
| POWER | 100-500 W | 200-300 W |
| PRESSURE | 50-300 MTORR | 160-200 MTORR |
| TEMPERATURE | 20° C. | 20° C. |

In the preferred embodiment of the process, the substrate is kept at a temperature of approximately 20° C. through "backside cooling," which is done by cooling the chuck upon which the wafer rests.

Although we only used a 20° C. wafer temperature, the process of the present invention can be used over a wide range of temperatures. At higher temperatures, the $Cl_2$:$NF_3$ ratio would have to be increased in order to keep the tip 13 tall enough, and at still higher temperatures one may have to use a combination of F and Br, Cl and Br, or F and Cl and Br in order to maintain the tip 13 height due to the increase in volatility of the etch products (e.g. $SiF_4$ and $SiCl_4$) at higher temperatures.

In other words, the temperature dependence of the volatilities of the etch products (for example, $SiF_4$ and $SiCl_4$) is important. Changing the temperatures, can change the volatilities, and therefore the height and width ratio.

While the invention is presently in the developmental stage, it is anticipated that the inventive process will include a low pressure atmosphere in order to produce a faster oxide etch rate. Low pressure allows for more ion bombardment because of the longer mean free path that the ions have before colliding with the surface, or other ions. When combined with high radio frequency (RF) power, the etch rate is increased. Low pressure and RF power do have drawbacks, however. Although RF induced ion bombardment assists in oxide etch, it also contributes to photoresist erosion, which is undesirable. Further, if RF power is too high, the resist will "burn" or reticulate.

The use of a low pressure process for etching oxide in the present invention overcomes the negative effects mentioned above by the use of a magnetic field and helium cooled wafers.

Any combination of halide (e.g. fluorine, chlorine, bromine, etc.) containing etch process gases can be used for which the etch products resulting from the plasma assisted reaction of the reactant process gases and the substrate have significantly different volatilities (also referred to as vapor pressure) at the temperature at which the etch takes place. The ratio of the halide containing process gases is used to control the degree of isotropy or anisotropy (perfect anisotropy creating substantially vertical sidewalls), and the height and width at the base of the cathode tip 13.

The degree of isotropy (also referred to as the degree of undercut) is a product of the differing volatilities of the different etch products. For example, in our etch using fluorine (in the form of $NF_3$) and chlorine (in the form of $Cl_2$), the resulting etch products, $SiF_4$ and $SiCl_4$, have different volatilities, and therefore evaporate at different rates, thereby determining the height to width ratio. Different ratios of fluorine to chlorine yield different ratios of height to width.

The primary means of controlling the height to width ratio of the tip 13 formed by the process of the present invention is through the combination of halide containing gases. However, by making use of the temperature dependence of the evaporation rate of the etch products in combination with the increased removal rate of the etch products in a directional way (due to the directional nature of plasma created ions "sputtering" off the etch product). One may control the height to width ratio of the tip 13 by controlling the temperature and/or the impact energy of the ions in the plasma. Ion impact energy is increased by raising the RF power or lowering the process pressure (this increases the mean free path as described above).

The process of the present invention is dependent upon the combination of two different gases having good selectivity with respect to the oxide mask 30. In such a case, the etch will not be bound by the normal height to width etch ratio of 1:1, but the etch can be controlled through the gas flow, i.e. the ratio of fluorine to chlorine. The degree of the undercut (also referred to as isotropy) can be substantially controlled by regulating the amount and partial pressure of the reactant etching gases.

The amount of power to be supplied, and hence, the RF field or magnetic field created by the power supply depends on the flow of the etchant gases selected, which flow is dependent on the size and sharpness of the emitter tips 13 desired.

One having ordinary skill in the art will realize that the other frequencies of energy (e.g. microwaves) other than RF could be adapted for use in the process of the present invention. Further, although the plasma etches of the present invention were carried out in a reactive ion etch (R.I.E.) reactor, a cyclotron could be used, as well.

Figure 5:
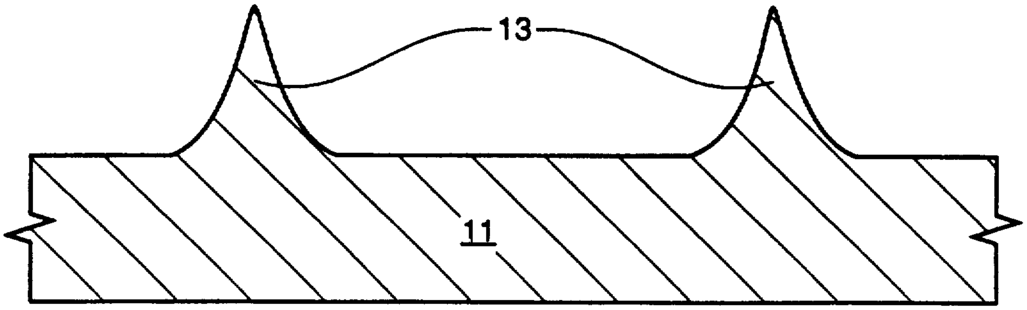
FIG. 5 is a cross-sectional schematic drawing of the structure of FIG. 4, depicting the sharp cathode tip after the silicon etch has been completed, and the mask layer has been removed.

After the emitter tip 13 is fabricated, and the desired dimensions have been achieved, the oxide mask layer 30 can be removed, as depicted in FIG. 5. The mask layer 30 can be stripped by any of the methods well known in the art, for example, a wet etch using a hydrogen fluoride (HF) solution or other HF containing mixture. In the preferred embodiment, the mask layer 30 and the photoresist layer 32 will be substantially consumed by the process of the etch, and the substrate 11 can be dipped in a HF bath. During the silicon substrate 11 etch, the mask layer 30 and photoresist layer 32 may simply fall off the tip 13 as the tip 13 becomes sharper and sharper.

All of the U.S. patents and patent applications cited herein are hereby incorporated by reference herein as if set forth in their entirety.

While the particular process for creating sharp emitter tips for use in flat panel displays as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, the process of the present invention was discussed with regard to the fabrication of sharp emitter tips for use in flat panel displays, however, one with ordinary skill in the art will realize that such a process can applied to other field ionizing and electron emitting structures.

We claim:

1. An in situ etch process for the formation of emitter tips, said process comprising the following steps:

providing a substrate having a mask layer and a photoresist layer disposed thereon;

patterning said photoresist layer and said mask layer; and subjecting said substrate having said mask layer and said photoresist layer disposed thereon to a plasma comprising a halogenated species in a plasma reactor, thereby forming said emitter tips, said emitter tips being formed in a single etch step.

2. The process according to claim 1, wherein said mask layer is an oxide.

3. The process according to claim 2, further comprising the step of:

stripping said hard mask after subjecting said substrate to said plasma.

4. The process according to claim 3, wherein said stripping step is a wet etch, said wet etch comprising hydrogen fluoride.

5. The process according to claim 1, wherein said emitter tips have an apex diameter in the approximate range of 7Å–10Å.

6. The process according to claim 1, wherein said process is performed in a single chamber of said plasma reactor.

7. A method for fabricating sharp tips comprising the following steps:

providing a silicon substrate having a mask layer and a patterned photoresist layer disposed thereon;

etching said mask layer in a first plasma; and etching said substrate in another plasma comprising fluorine and chlorine compounds, thereby forming said tips in a single isotropic etch step wherein said tip sharpness is controlled by a ratio of fluorine to chlorine compounds in said plasma.

8. The process according to claim 7, wherein said fluorine to chlorine ratio is in the approximate range of 1:5.

9. The process according to claim 7, wherein said mask layer is an oxide.

10. The process according to claim 7, wherein said fluorine compound is $NF_3$.

11. The process according to claim 10, wherein said chlorine compound is $Cl_2$.

12. The process according to claim 7, further comprising the step of:

removing said mask layer using a wet etch, said wet etch comprising hydrogen fluoride.

13. The process according to claim 7, further comprising the step of:

cooling the lower side of said substrate while said substrate is being etched.

14. The process according to claim 7, further comprising the step of:

removing said photoresist layer.

* * * * *